United States Patent
Buer

(10) Patent No.: US 8,462,575 B2
(45) Date of Patent: Jun. 11, 2013

(54) MULTI-TIME PROGRAMMABLE MEMORY

(75) Inventor: Myron Buer, Savage, MN (US)

(73) Assignee: Broadcom Corporation, Irvine, CA (US)

( * ) Notice: Subject to any disclaimer, the term of this patent is extended or adjusted under 35 U.S.C. 154(b) by 161 days.

(21) Appl. No.: 13/034,395

(22) Filed: Feb. 24, 2011

(65) Prior Publication Data

US 2012/0014200 A1 Jan. 19, 2012

Related U.S. Application Data

(60) Provisional application No. 61/364,248, filed on Jul. 14, 2010.

(51) Int. Cl.
*G11C 17/18* (2006.01)

(52) U.S. Cl.
USPC ...... 365/225.7; 365/94; 365/96; 365/189.011

(58) Field of Classification Search
USPC ............................ 365/225.7, 189.011, 96, 94
See application file for complete search history.

(56) References Cited

U.S. PATENT DOCUMENTS

| | | | | |
|---|---|---|---|---|
| 6,930,920 | B1 * | 8/2005 | Look | 365/185.18 |
| 6,933,591 | B1 * | 8/2005 | Sidhu et al. | 257/665 |
| 6,979,879 | B1 * | 12/2005 | Yindeepol et al. | 257/530 |
| 7,561,456 | B2 * | 7/2009 | Vasiliu | 365/96 |
| 7,696,017 | B1 * | 4/2010 | Tripsas et al. | 438/128 |

* cited by examiner

*Primary Examiner* — Pho M Luu

(74) *Attorney, Agent, or Firm* — Sterne, Kessler, Goldstein & Fox P.L.L.C.

(57) ABSTRACT

Multi-time programmable memory elements are disclosed. The disclosed memory elements extend the capability of fuse elements, anti-fuse elements, and combinations thereof to enable multi-time programmability. The disclosed memory elements significantly reduce area requirements and control circuitry complexity of memory elements. The disclosed memory elements can be used in non-volatile memory storage, and are suitable for use in system on chip (SoC) products.

22 Claims, 6 Drawing Sheets

MULTI-TIME PROGRAMMABLE MEMORY

CROSS-REFERENCE TO RELATED APPLICATIONS

The present application claims the benefit of U.S. Provisional Patent Application No. 61/364,248, filed on Jul. 14, 2010, which is incorporated herein by reference in its entirety.

BACKGROUND

1. Field of the Invention

The present invention relates generally to memory elements.

2. Background Art

Conventional fuse and anti-fuse elements provide one-time programmable memory elements. In other words, the element starts in a default or initial state and can be programmed only once into a final state. Once programmed into the final state, the element cannot be re-programmed into a further state.

Conventionally, to enable multi-time programmability, the fuse or anti-fuse element is replicated based on the desired programmability. Thus, conventional fuse and anti-fuse elements can be area inefficient solutions when large memory is needed.

Accordingly, there is a need for multi-time programmable memory elements.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
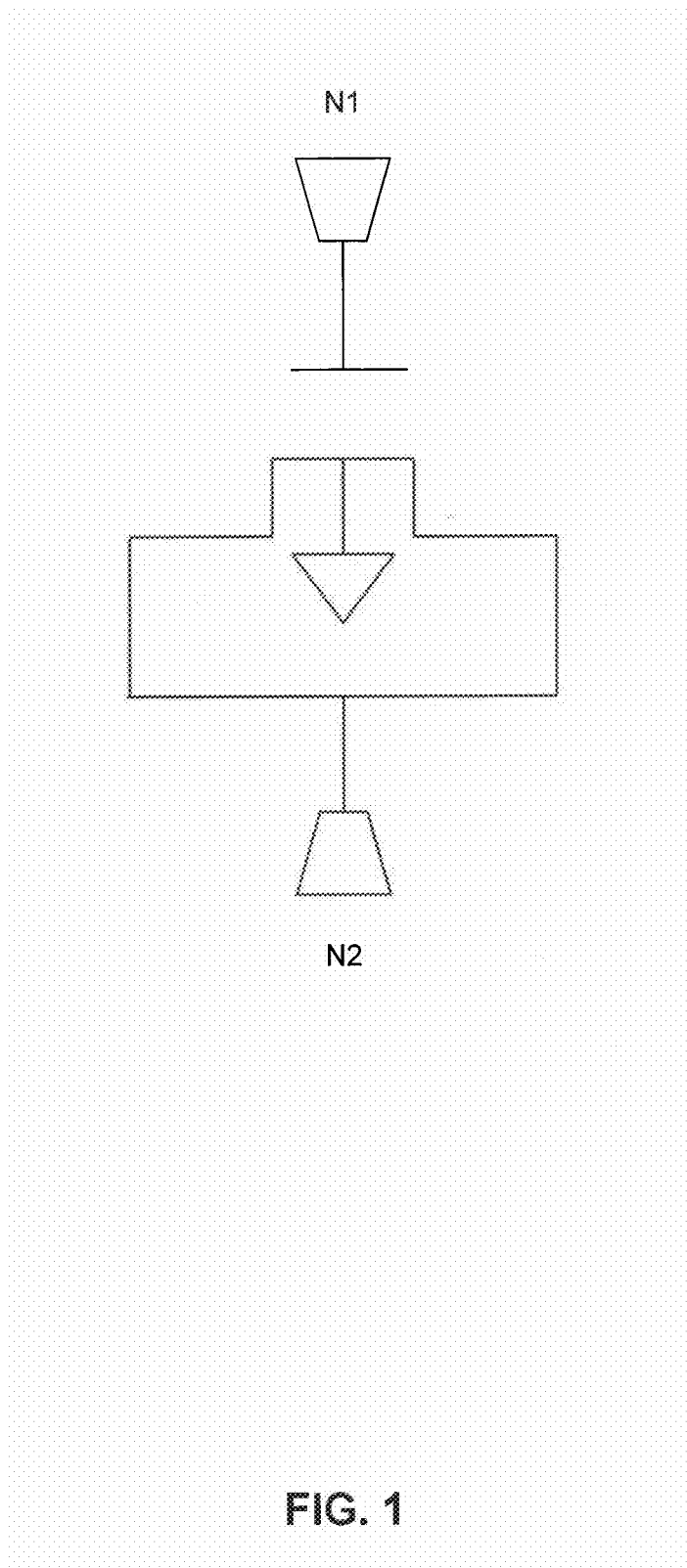
FIGS. 1-4 illustrate various one-time programmable memory elements.

FIGS. 6A-D illustrate example programming states of a memory element according to an embodiment of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Fuse and anti-fuse elements can be used as memory elements. Generally, an anti-fuse element is one that initially is in an open or high impedance state and which can be programmed once into a short or low impedance state. A fuse element is one that initially is in a short or low impedance state and which can be programmed once into an open or high impedance state. Thus, fuse and anti-fuse elements are generally one-time programmable memory elements. The initial or default state may correspond to a logic 0 or to a logic 1, with the subsequent programming state corresponding to a logic 1 or logic 0, respectively.

FIG. 1 illustrates an example NMOS anti-fuse element. The NMOS anti-fuse element is a gate oxide that starts in an open or high impedance state and which can be programmed into a short or low impedance state. Programming of the NMOS anti-fuse element is done by providing a high voltage across its terminals N1 and N2. The high voltage breaks down the oxide, turning it into a resistive short between N1 and N2. Further description of an NMOS anti-fuse element can be found in commonly-owned U.S. Pat. No. 7,649,798, which is incorporated herein by reference in its entirety.

Figure 2:
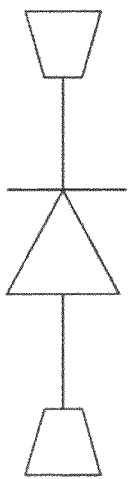

FIG. 2 illustrates an example poly diode anti-fuse element. The poly diode anti-fuse element is a non-salicided poly silicon having a highly N-doped region and a highly P-doped region, which create a reverse biased junction (or effectively a diode). The poly diode anti-fuse starts in an open or high impedance state and can be programmed into a short or low impedance state. Programming of the poly diode anti-fuse is done by providing a high voltage across its terminals N1 and N2 to cause it into a highly reverse biased state, which ultimately shorts the element.

Figure 3:
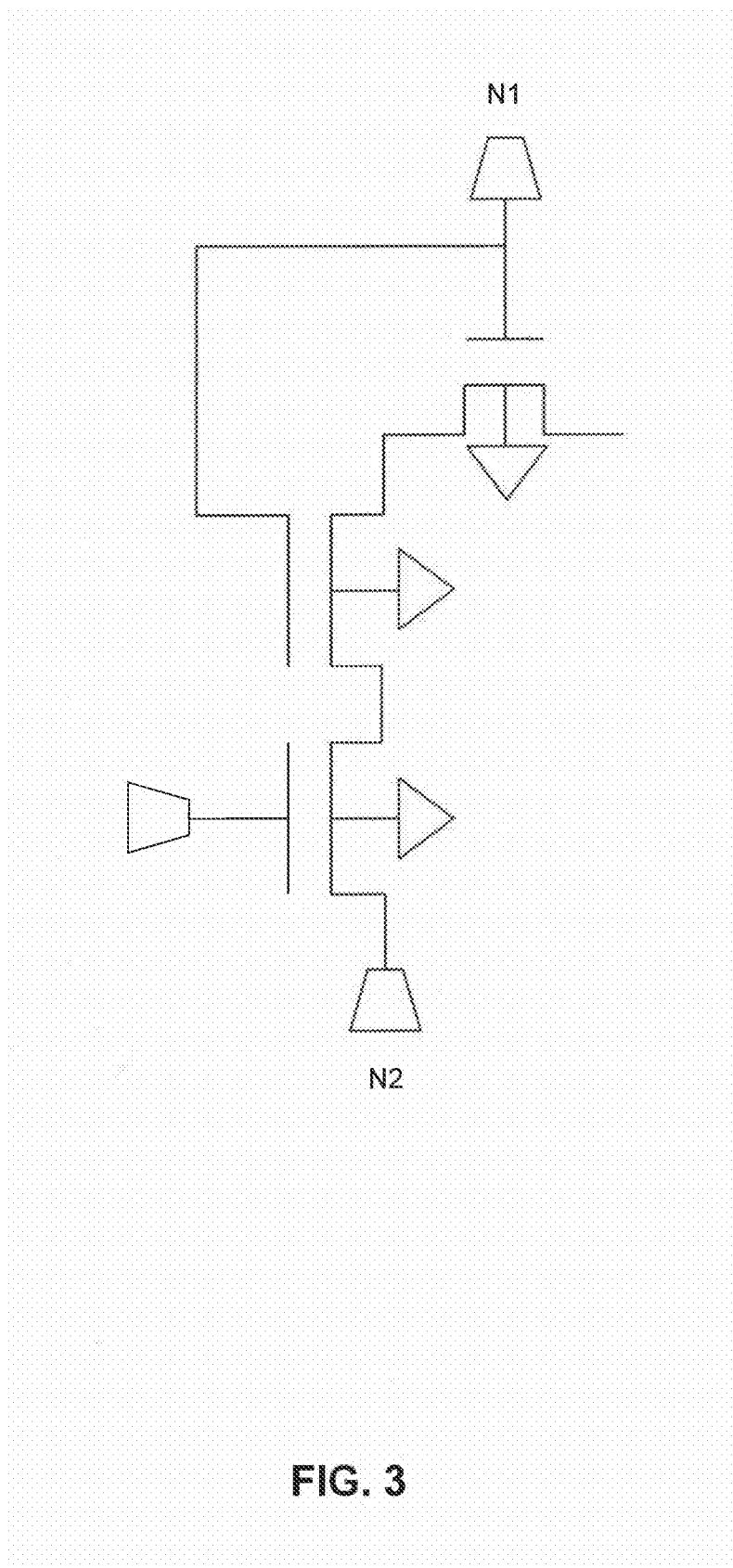

FIG. 3 illustrates an example 3T (three-transistor) anti-fuse. As with the NMOS anti-fuse and the poly diode anti-fuse, the 3T anti-fuse starts in an open state or high impedance state and can be programmed into a short or low impedance state.

Figure 4:
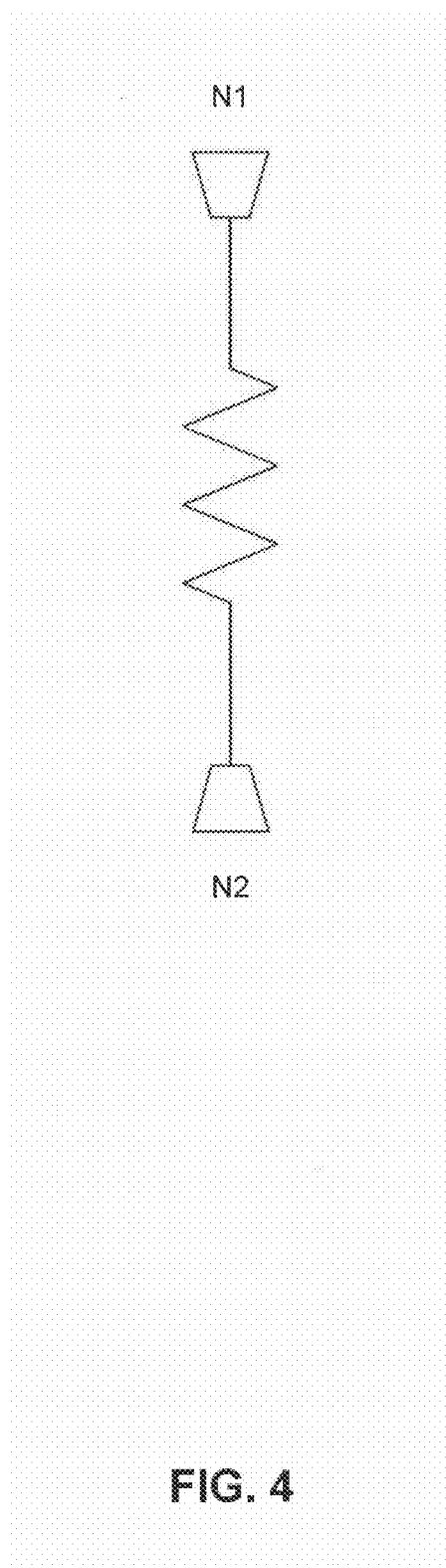

FIG. 4 illustrates an example poly fuse element. The poly fuse element is a poly silicon resistor having a salicide (self-aligned silicide) top layer. The poly fuse element starts in a short or low impedance state and can be programmed into an open or high impedance state. Programming of the poly fuse element is done by applying a high current through it, which causes the melting of the salicide top layer, thereby creating a change in the impedance of the poly fuse element (from low impedance to a higher impedance). Further description of a programmable poly fuse element can be found in commonly-owned U.S. Pat. No. 7,561,456, which is incorporated herein by reference in its entirety.

Conventional fuse and anti-fuse elements, such as the ones illustrated in FIGS. 1-4, provide one-time programmable memory elements. In other words, the element starts in a default or initial state and can be programmed only once into a final state. Once programmed into the final state, the element cannot be re-programmed into a further state.

Conventionally, to enable multi-time programmability, the fuse or anti-fuse element is replicated based on the desired programmability. For example, to enable a two-time programmable k-bit anti-fuse memory structure, two k-bit banks of anti-fuse elements are needed, with the first bank corresponding to the initial state of the memory structure and the second bank corresponding to the final state. Thus, conventional fuse and anti-fuse elements can be area inefficient solutions when large memory is needed. Additionally, to enable multi-time programmability, control circuitry, including multiplexing and/or logic circuitry, for example, is needed to determine which bank of elements should be read at any given time and to enable the reading of the currently programmed bank. Further, because each additional programming state (after the first programming) of the memory structure corresponds to a separate bank of elements, even when a single bit of data of the k-bit memory structure is being modified (i.e., a single fuse or anti-fuse element is being programmed) the entire k-bit memory structure must be re-written into the bank corresponding to the additional programming state.

Embodiments extend the capability of fuse elements, anti-fuse elements, and combinations thereof to enable multi-time programmable memory elements. At the same time, embodiments significantly reduce area requirements and control circuitry complexity. Embodiments can be used in non-volatile memory storage, for example, and are suitable for use in system on chip (SoC) products. In the following, exemplary embodiments will be provided. As would be understood by a person skilled in the art based on the teachings herein, embodiments are not limited to the exemplary embodiments provided herein, but extend to any variations and/or improvements that would be apparent to a person skilled in the art.

Figure 5:
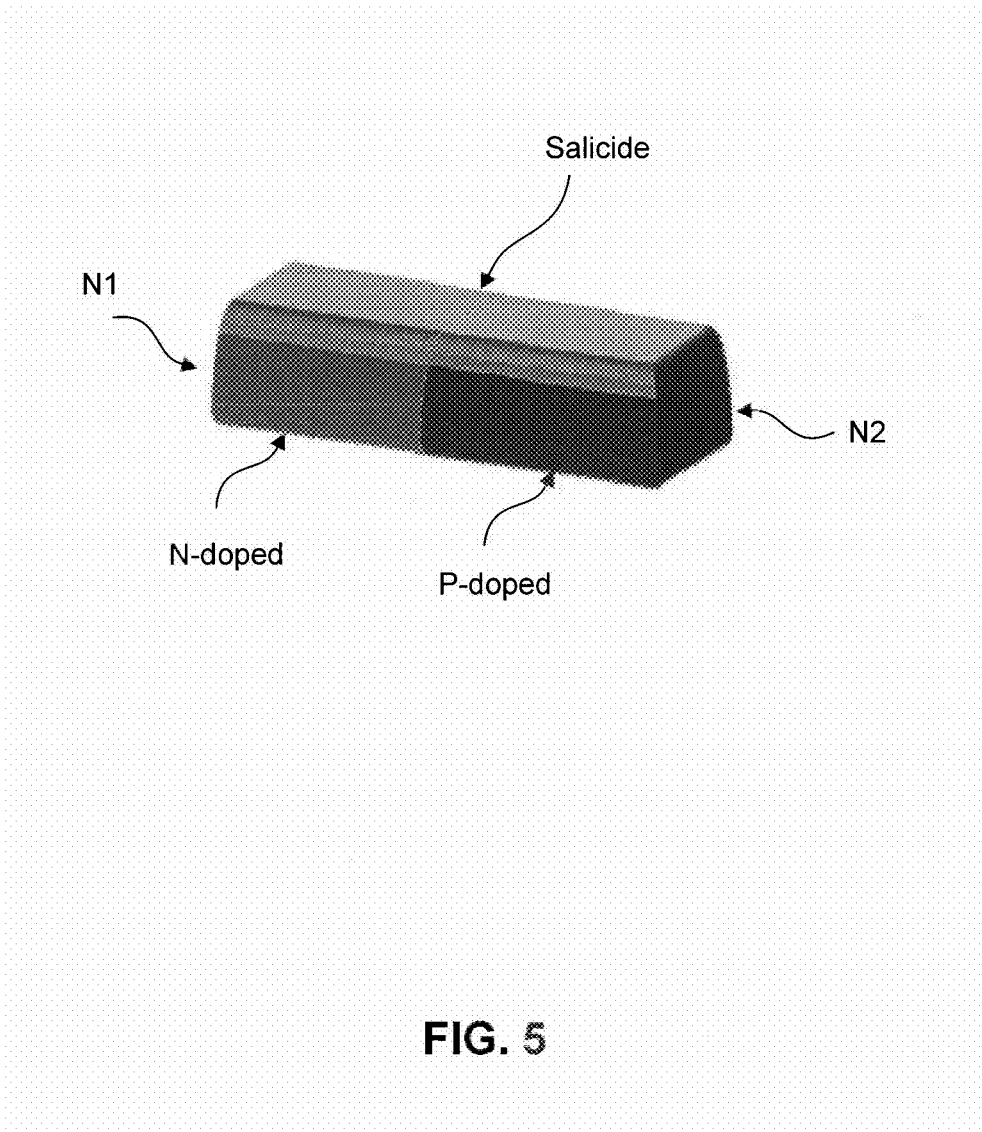
FIG. 5 illustrates an example memory element according to an embodiment of the present invention.

FIG. 5 illustrates an example memory element according to an embodiment of the present invention. In particular, FIG. 5 shows an example poly silicon element. The poly silicon element includes an N-doped and a P-doped region, which create a poly silicon diode, underlying a salicide top layer.

The poly silicon element, as further described below, is a multi-time programmable element. In an embodiment, the poly silicon element can be designed as a three-time programmable element. While the poly silicon element may be slightly larger than a conventional poly fuse or a conventional poly diode anti-fuse, by providing multi-time programmability (e.g., up to three times) significant area savings can still be achieved. Furthermore, when used in a memory structure (e.g., k-bit memory), the memory element can be re-programmed independently of other memory elements, thereby eliminating the need to re-write the entire k-bit memory structure each time that a memory element is re-programmed. Accordingly, re-writing of the k-bit memory structure is only needed when a given memory element has exhausted its re-programmability ability.

In an embodiment, the poly silicon element shown in FIG. 5 provides a three-time programmable memory element, as further described with reference to FIGS. 6A-D. As would be understood by a person of skill in the art based on the teachings herein, embodiments may be designed to have more than three programming states.

Figure 6D:
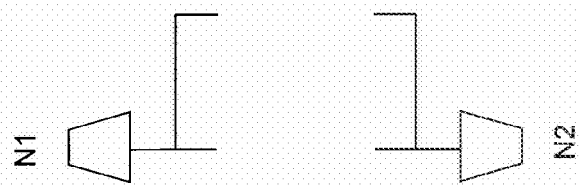
Figure 6C:
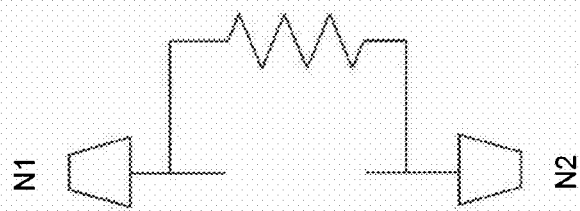
Figure 6B:
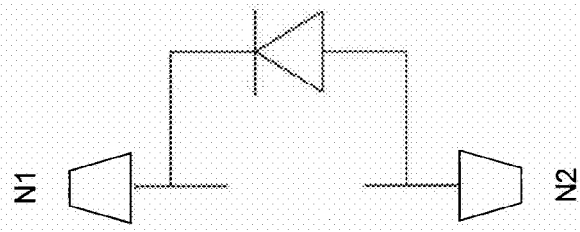
Figure 6A:
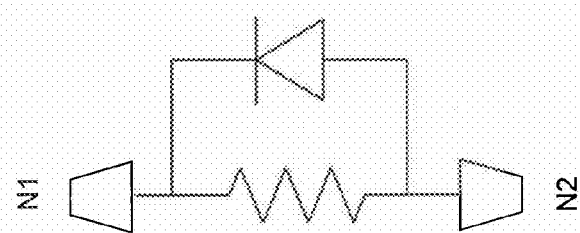

In its initial or default state (e.g., corresponds to logic 0), the poly silicon element can be schematically represented, as shown in FIG. 6A, as a poly fuse element (the salicide layer) in parallel with a poly diode anti-fuse element (the N-doped and P-doped region). Because the poly fuse provides a very low impedance in parallel with the poly diode anti-fuse, the poly silicon element is effectively a short circuit.

The poly silicon element provides a first programming state (e.g., to re-program the element from a logic 0 to a logic 1) as shown in FIG. 6B. To arrive at the first programming state, a high current is applied to the poly silicon element between its terminals N1 and N2 to open the salicide layer. With the salicide layer eliminated as a conduction path between N1 and N2, a high impedance is created by the underlying poly diode anti-fuse. The low to high impedance change corresponds to a logic 0 to a logic 1 re-programming of the element, for example.

When further re-programming is needed, the poly silicon element provides a second programming state (e.g., to re-program the element from a logic 1 to a logic 0) as shown in FIG. 6C. The second programming state is reached by providing a high voltage across the terminals N1 and N2 to cause the poly diode anti-fuse into a highly reversed biased state, effectively causing it to act as a resistive element with low impedance.

When further re-programming is needed, the poly silicon element provides a third and final programming state (e.g., to re-program the element from a logic 0 to a logic 1) as shown in FIG. 6D. The third programming state is reached by providing a very high current through the n-p junction, effectively opening the junction to act as an open circuit or a high impedance between N1 and N2.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A memory element, comprising:
   a first terminal coupled to an N-doped region of said memory element;
   a second terminal coupled to a P-doped region of said memory element, wherein said N-doped region and P-doped region provide a poly diode anti-fuse; and
   a silicide layer overlaying said N-doped region and P-doped region, wherein said silicide layer provides a poly fuse in parallel with said poly diode anti-fuse in an initial programming state of said memory element,
   wherein said memory element provides a first programming state, and wherein a first impedance of said memory element in said first programming state is higher than an initial impedance of said memory element in said initial programming state.

2. The memory element of claim 1, wherein the memory element is multi-time programmable.

3. The memory element of claim 1, wherein the memory element is at least three-time programmable.

4. The memory element of claim 1, wherein said poly fuse provides a very low impedance in parallel with said poly diode anti-fuse in said initial programming state.

5. The memory element of claim 4, wherein said memory element acts as a short circuit between said first terminal and said second terminal in said initial programming state.

6. The memory element of claim 1, wherein said first programming state is achieved by applying a first current between said first terminal and said second terminal of said memory element.

7. The memory element of claim 6, wherein said first current opens said silicide layer.

8. The memory element of claim 6, wherein said poly diode anti-fuse provides said first impedance of said memory element in said first programming state.

9. The memory element of claim 1, wherein said memory element provides a second programming state, wherein a second impedance of said memory element in said second programming state is lower than said first impedance of said memory element in said first programming state.

10. The memory element of claim 9, wherein said second programming state is achieved by applying a first voltage across said first terminal and said second terminal of said memory element.

11. The memory element of claim 10, wherein said first voltage causes said poly diode anti-fuse into a highly reverse biased state.

12. The memory element of claim 11, wherein said poly diode anti-fuse acts as a resistive element with low impedance in said second programming state and provides said second impedance of said memory element.

13. The memory element of claim 9, wherein said memory element provides a third programming state, wherein a third impedance of said memory element in said third programming state is higher than said second impedance of said memory element in said second programming state.

14. The memory element of claim 13, wherein said third programming state is achieved by applying a second current between said first terminal and said second terminal of said memory element.

15. The memory element of claim 14, wherein said second current opens a n-p junction formed by said N-doped region and P-doped region of said memory element.

16. The memory element of claim 15, wherein said memory element acts as an open circuit between said first terminal and said second terminal in said third programming state.

17. A memory structure, comprising:
a plurality of programmable memory elements, wherein at least one memory element of said plurality of memory elements comprises:
a first terminal coupled to an N-doped region;
a second terminal coupled to a P-doped region; and
a silicide layer overlaying said N-doped region and P-doped region,
wherein in an initial programming state of the at least one memory element, the N-doped region and the P-doped region provide a poly diode anti-fuse and the silicide layer provides a poly fuse in parallel with the poly diode anti-fuse, resulting in an initial impedance of the at least one memory element, and
wherein in a first programming state of the at least one memory element, a first impedance of the at least one memory element is higher than the initial impedance of the at least one memory element.

18. The memory structure of claim 17, wherein the memory structure requires complete re-writing only when one of said plurality of programmable memory elements has exhausted all of its available programming states.

19. The memory structure of claim 17, wherein each of said plurality of programmable memory elements is at least three-time programmable.

20. The memory structure of claim 17, wherein the at least one memory element is programmable independently of other memory elements of said plurality of programmable memory elements.

21. A memory element having an initial programming state and a first programming state, comprising:
an N-doped region;
a P-doped region; and
a silicide layer overlaying the N-doped region and the P-doped region,
wherein, in the initial programming state, the N-doped region and the P-doped region provide a poly diode anti-fuse, resulting in an initial impedance of the memory element, and
wherein, in the first programming state, a first impedance of the memory element is higher than the initial impedance of the memory element.

22. The memory element of claim 21, wherein in the first programming state, the suicide layer is open.

* * * * *

UNITED STATES PATENT AND TRADEMARK OFFICE
CERTIFICATE OF CORRECTION

PATENT NO. : 8,462,575 B2
APPLICATION NO. : 13/034395
DATED : June 11, 2013
INVENTOR(S) : Myron Buer Page 1 of 1

It is certified that error appears in the above-identified patent and that said Letters Patent is hereby corrected as shown below:

In the Claims:

Claim 22, Column 6, Line 30, "suicide" should be replaced with --silicide--.

Signed and Sealed this
Sixth Day of August, 2013

Teresa Stanek Rea
*Acting Director of the United States Patent and Trademark Office*